(12) United States Patent
Yang et al.

(10) Patent No.: US 12,550,508 B2
(45) Date of Patent: Feb. 10, 2026

(54) LIGHT-EMITTING DIODE AND MANUFACTURING METHOD THEREOF

(71) Applicant: EPISTAR CORPORATION, Hsinchu (TW)

(72) Inventors: Jhih Yong Yang, Hsinchu (TW); Hsin Ying Wang, Hsinchu (TW); De Shan Kuo, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 0 days.

(21) Appl. No.: 18/330,562

(22) Filed: Jun. 7, 2023

(65) Prior Publication Data

US 2023/0317912 A1 Oct. 5, 2023

Related U.S. Application Data

(63) Continuation of application No. 16/876,377, filed on May 18, 2020, now abandoned.

(30) Foreign Application Priority Data

May 20, 2019 (TW) .................. 108117385

(51) Int. Cl.
*H10H 20/857* (2025.01)
*H10H 20/819* (2025.01)
*H10H 20/01* (2025.01)

(52) U.S. Cl.
CPC ........ *H10H 20/857* (2025.01); *H10H 20/819* (2025.01); *H10H 20/0364* (2025.01)

(58) Field of Classification Search
CPC .............. H10H 20/857; H10H 20/819; H10H 20/0364; H10H 20/032; H10H 20/833;
(Continued)

(56) References Cited

U.S. PATENT DOCUMENTS

2012/0049219 A1 3/2012 Kamiya et al.
2012/0199861 A1 8/2012 Tsuji
(Continued)

FOREIGN PATENT DOCUMENTS

| CN | 108346726 A | 7/2008 |
| CN | 103811617 A | 5/2014 |
| CN | 106505132 A | 3/2017 |

*Primary Examiner* — Su C Kim
(74) *Attorney, Agent, or Firm* — MUNCY, GEISSLER, OLDS & LOWE, P.C.

(57) ABSTRACT

A light-emitting diode, includes a semiconductor stack, including a first semiconductor layer, an active region and a second semiconductor layer; a transparent conductive layer formed on the semiconductor stack and electrically connected to the second semiconductor layer; an insulating layer formed on the transparent conductive layer, comprising a plurality of first opening; a first electrode formed on the insulating layer, electrically connected to the first semiconductor layer; and a second electrode formed on the insulating layer, comprising a second pad and a second extension extending from the second pad along a long side of the light-emitting diode toward the first electrode, electrically connected to the transparent conductive layer, wherein the second extension comprise a plurality of node parts and a plurality of linking parts alternately disposed, and in a plan view, the node part has a width smaller than that of the second pad and lager than that of the linking part and that of the first opening; wherein the second extension does not overlap the first electrode; and wherein the plurality of node parts contacts the transparent conductive layer through the plurality of the first openings.

20 Claims, 13 Drawing Sheets

(58) Field of Classification Search
CPC ............. H10H 20/831; H10H 20/8312; H10H 20/8316
See application file for complete search history.

(56) References Cited

U.S. PATENT DOCUMENTS

| | | | |
|---|---|---|---|
| 2014/0117402 A1* | 5/2014 | Wang | H01L 33/382 |
| | | | 257/99 |
| 2016/0013388 A1 | 1/2016 | Lee et al. | |
| 2016/0118564 A1* | 4/2016 | Kim | H10H 20/857 |
| | | | 257/99 |
| 2017/0108173 A1 | 4/2017 | Kim et al. | |
| 2017/0250314 A1* | 8/2017 | Ishiguro | H10H 20/8316 |
| 2019/0115511 A1* | 4/2019 | Lin | H01L 33/10 |

* cited by examiner

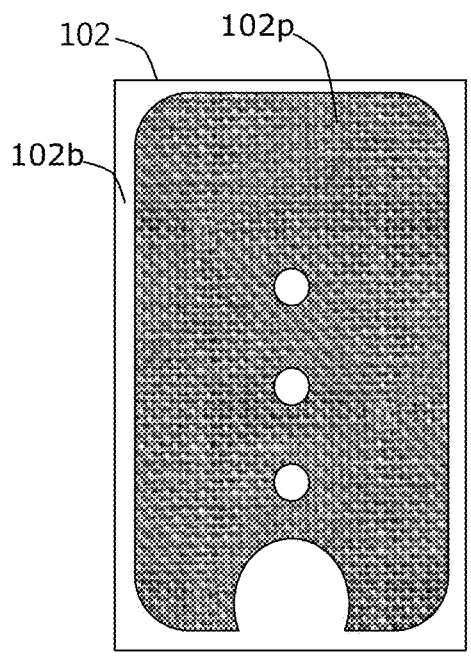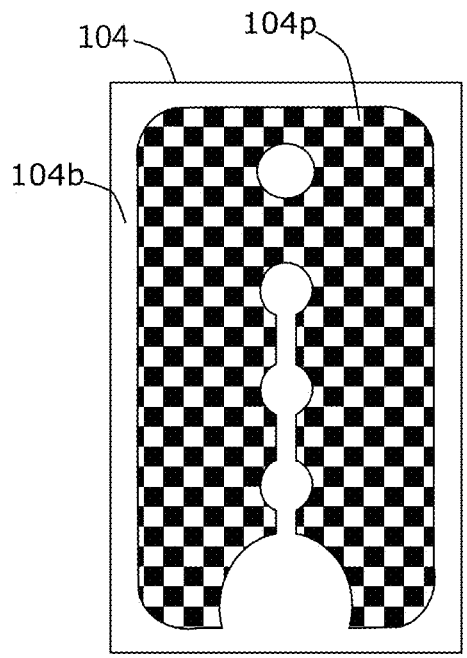
FIG.1A  FIG.1B
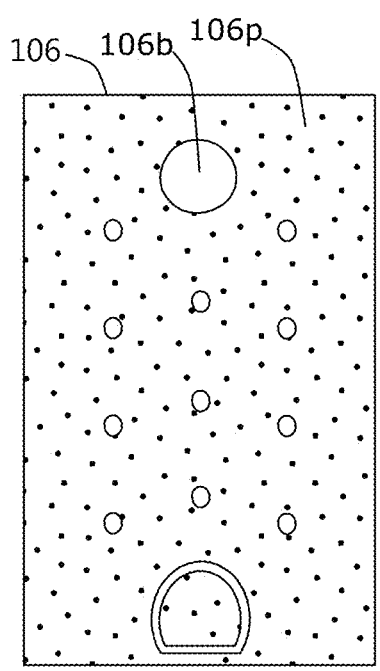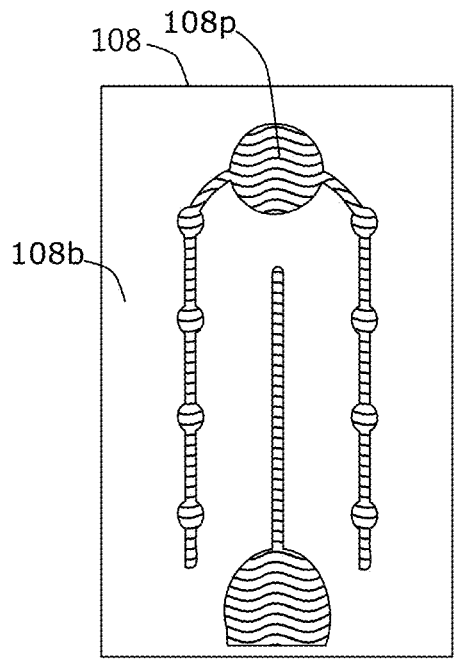
FIG.1C  FIG.1D

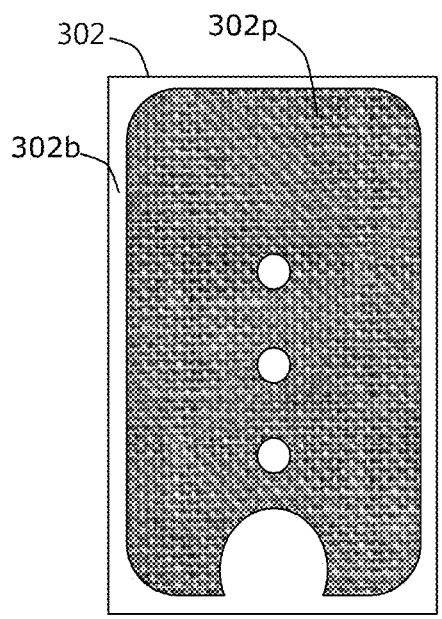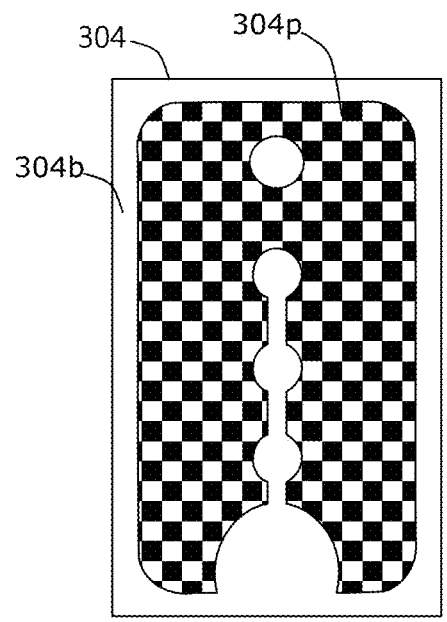
FIG.9A  FIG.9B
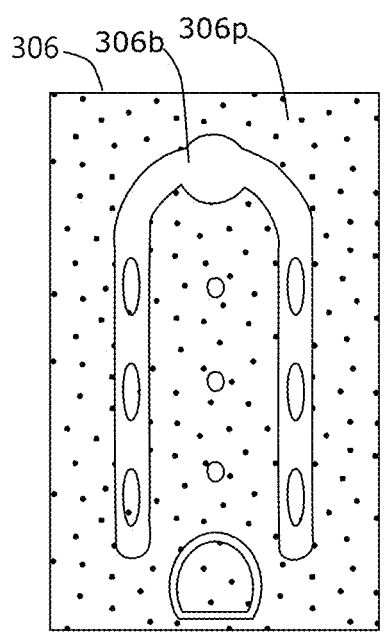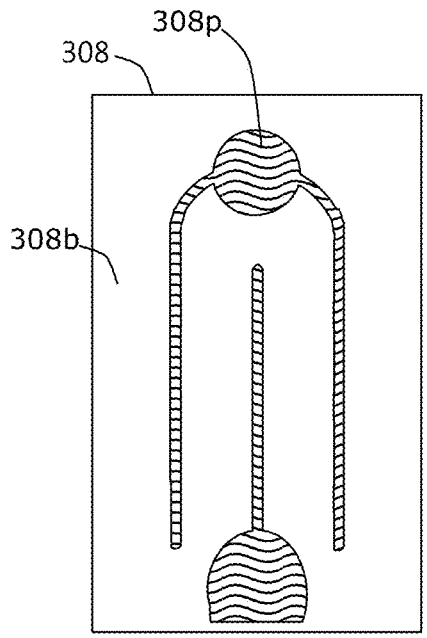
FIG.9C  FIG.9D

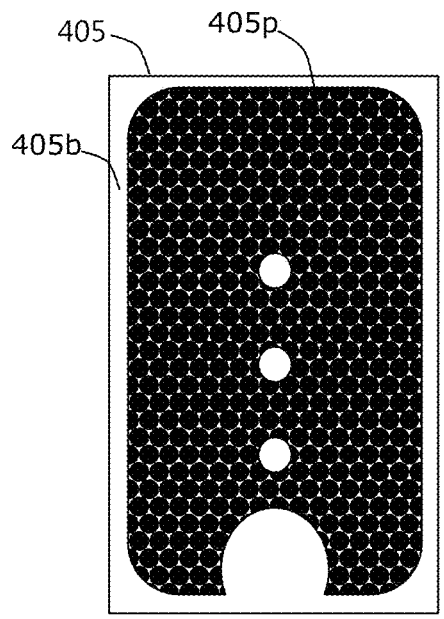
FIG.12A
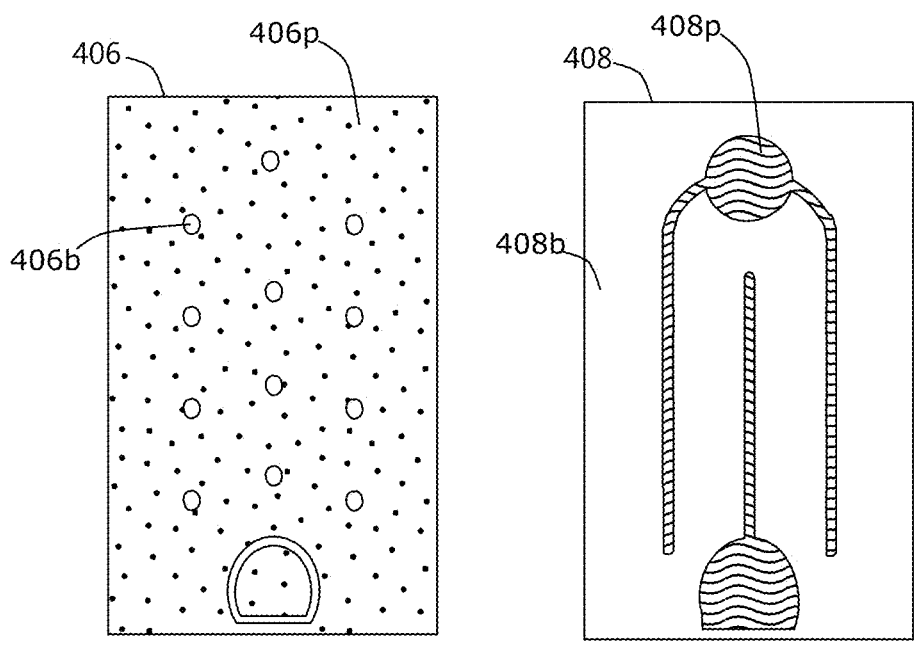
FIG.12B
FIG.12C

US 12,550,508 B2

LIGHT-EMITTING DIODE AND MANUFACTURING METHOD THEREOF

CROSS-REFERENCE TO RELATED APPLICATIONS

This application is a continuation application of U.S. patent application Ser. No. 16/876,377, filed on May 18, 2020, which claims priority to the benefit of Taiwan Patent Application Number 108117385 filed on May 20, 2019, and the entire contents of which are hereby incorporated by reference herein in its entirety.

BACKGROUND

Technical Field

The present disclosure relates to a light-emitting diode, more specifically, to a light-emitting diode with an improved brightness and/or an improved current distribution.

Description of the Related Art

The light-emitting diodes (LEDs) have the characteristics of low power consumption, low heat-generation, long lifetime, shockproof, compact size, and high response speed. Thus, the LEDs are suitable for various lighting applications and display applications.

A conventional LED includes compound semiconductor materials. Holes from the p-type semiconductor layer and electrons from the n-type semiconductor layer are combined to generate photons, thereby emitting light. One of the conventional manufacturing methods of the LED uses five mask patterns, which are respectively used to define mesa, current blocking layer, transparent conductive layer, electrodes, and insulating protective layer. The cost can be reduced and the yield can be increased if fewer masks are used.

SUMMARY OF THE DISCLOSURE

A light-emitting diode, includes a semiconductor stack, comprising a first semiconductor layer, an active region and a second semiconductor layer; a transparent conductive layer formed on the semiconductor stack and electrically connected to the second semiconductor layer; an insulating layer formed on the transparent conductive layer, comprising a plurality of first opening; a first electrode formed on the insulating layer, electrically connected to the first semiconductor layer; and a second electrode formed on the insulating layer, comprising a second pad and a second extension extending from the second pad along a long side of the light-emitting diode toward the first electrode, electrically connected to the transparent conductive layer, wherein the second extension comprise a plurality of node parts and a plurality of linking parts alternately disposed, and in a plan view, the node part has a width smaller than that of the second pad and lager than that of the linking part and that of the first opening; wherein the second extension does not overlap the first electrode; and wherein the plurality of node parts contacts the transparent conductive layer through the plurality of the first openings.

A light-emitting diode, includes a semiconductor stack, comprising a first semiconductor layer, an active region, and a second semiconductor layer; a recess formed in the semiconductor stack, wherein the recess comprises a side wall and a bottom, and wherein the side wall exposes the second semiconductor layer and the active region and the bottom exposes an upper surface of the first semiconductor layer; a transparent conductive layer formed on the semiconductor stack and electrically connecting the second semiconductor layer; an insulating layer formed on the transparent conductive layer, comprising a first opening and an insulating island formed in the first opening and covering the recess; a first electrode formed on the insulating layer, electrically connected to the first semiconductor layer; and a second electrode formed on the insulating layer, comprising a second pad and a second extension extending from the second pad along a long side of the light-emitting diode toward the first electrode and having a width smaller than that of the second pad; wherein the second extension is disposed on the recess and electrically connects to the transparent conductive layer through the first opening and electrically insulated from the first semiconductor layer through insulating island, and wherein in a plan view, the second extension has a width smaller than that of the recess.

A light-emitting diode, includes a semiconductor stack, comprising a first semiconductor layer, an active region, and a second semiconductor layer; an insulating layer formed on the semiconductor stack, comprising a first opening and a plurality of insulating islands separately disposed in the first opening; a first electrode formed on the insulating layer, electrically connected to the first semiconductor layer; a second electrode formed on the semiconductor stack, comprising a pad and an extension extending from the pad along a long side of the light-emitting diode toward the first electrode; wherein the extension electrically connects to the second semiconductor layer through the first opening, laterally extends along the first opening and covers the plurality of insulating islands.

BRIEF DESCRIPTION OF THE DRAWINGS

FIGS. 1A-1D show mask patterns for manufacturing a light-emitting diode 100 in accordance with a first embodiment of the present application.

FIG. 8 shows a cross-sectional view of the light-emitting diode 200a.

FIGS. 9A-9D show mask patterns for manufacturing a light-emitting diode 300 in accordance with a fourth embodiment of the present application.

FIGS. 12A-12C show mask patterns for manufacturing a light-emitting diode 400 in accordance with a fifth embodiment of the present application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

First Embodiment

Figure 2:
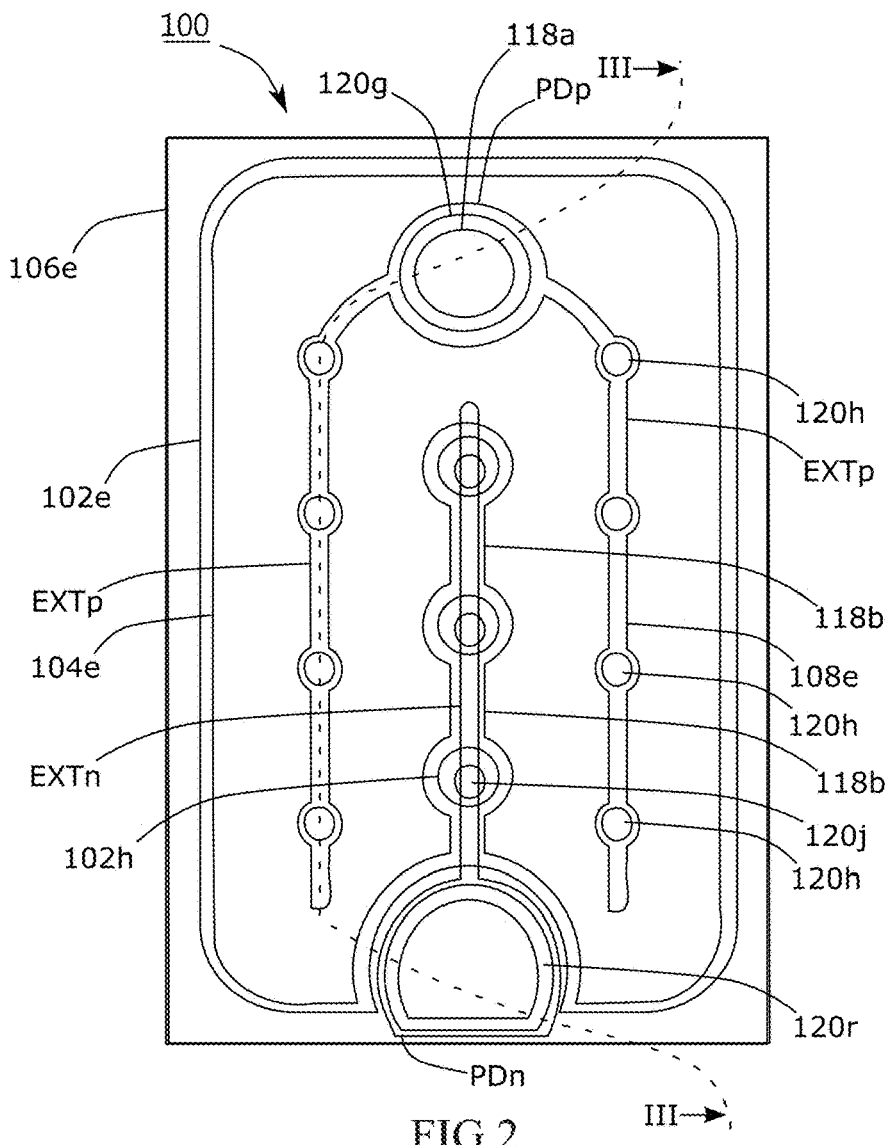
FIG. 2 shows a top view of the light-emitting diode 100 in accordance with the first embodiment of the present application.
Figure 3:
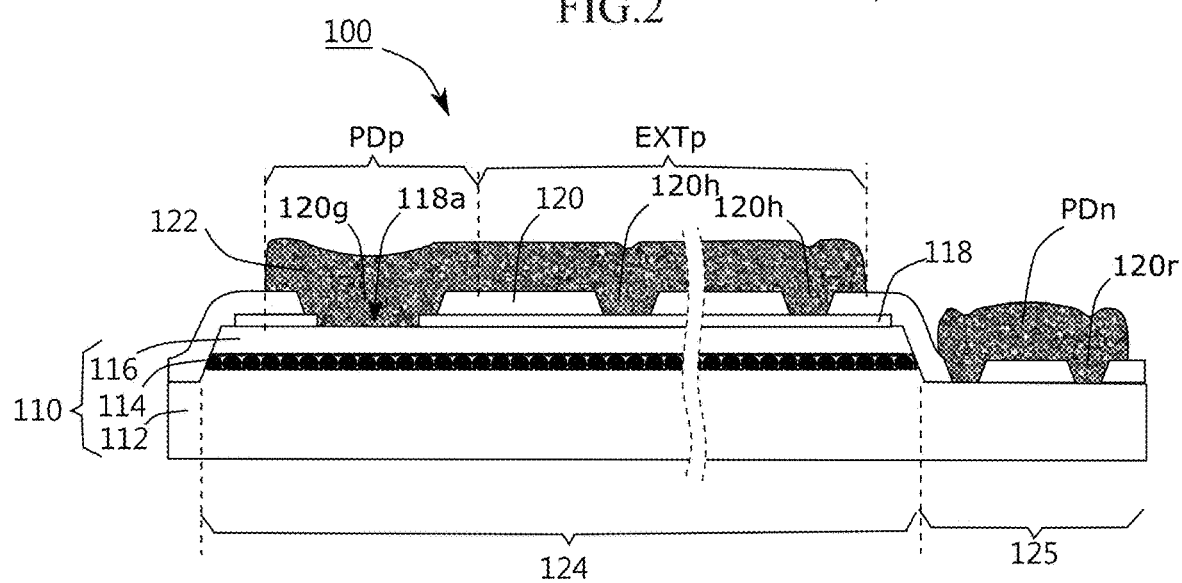
FIG. 3 shows a cross-sectional view of the light-emitting diode 100.

FIGS. 1A to 1D show the mask patterns for manufacturing a light-emitting diode 100 in accordance with the first embodiment of the present application, which are respectively labeled as mask pattern 102, mask pattern 104, mask pattern 106, and mask pattern 108. FIG. 2 shows a top view of the light-emitting diode 100 manufactured by the above mask patterns. FIG. 3 shows a cross-sectional view of the light-emitting diode 100 taken along the III-III line in FIG. 2.

As shown in FIG. 3, the light emitting diode 100 includes a semiconductor stack 110 formed on a substrate (not shown), a transparent conductive layer 118, an insulating layer 120, and an electrode layer 122.

In accordance with the first embodiment of manufacturing the light-emitting diode 100, in a first step, the semiconductor stack 110 is formed on the substrate. The substrate can be a growth substrate, including a substrate for growing AlGaInP semiconductor thereon, such as GaAs substrate or GaP substrate, or a substrate for growing InGaN or AlGaN thereon, such as sapphire substrate, GaN substrate, SiC substrate, or AlN substrate. The substrate can be a patterned substrate, that is, the substrate has a plurality of patterned structures on a top surface thereof. Light emitted from the semiconductor stack 110 can be refracted by the plurality of patterned structures, thereby increasing the brightness of the light-emitting diode. In addition, the plurality of patterned structures lessens or inhibits the dislocation due to lattice mismatch between the substrate and the semiconductor stack 110, thereby improving the epitaxial quality of the semiconductor stack 110.

In an embodiment of the present application, the semiconductor stack 100 is formed on the substrate by epitaxy such as metal-organic chemical vapor deposition (MOCVD), molecular beam epitaxy (MBE), hydride vapor epitaxy (HVPE), or physical vapor deposition such as sputtering or evaporating.

The semiconductor stack 110 includes a buffer structure (not shown), a first semiconductor layer 112, an active region 114, and a second semiconductor layer 116 sequentially formed on the substrate 10. The buffer structure can reduce the lattice mismatch and suppress dislocation, thereby improving the epitaxial quality. The material of the buffer structure includes GaN, AlGaN, or AlN. In an embodiment, the buffer structure includes a plurality of sub-layers (not shown). The sub-layers include the same material or different materials. In one embodiment, the buffer structure includes two sub-layers, wherein a first sub-layer thereof is grown by sputtering and a second sub-layer thereof is grown by MOCVD. In another embodiment, the buffer structure further includes a third sub-layer. The third sub-layer is grown by MOCVD, and the growth temperature of the second sub-layer is higher or lower than the growth temperature of the third sub-layer. In an embodiment, the first, second, and third sub-layers include the same material, such as AlN. In an embodiment, the first semiconductor layer 112 and the second semiconductor layer 116 are, for example, a cladding layer or a confinement layer. The first semiconductor layer 112 and the second semiconductor layer 116 have different conductivity types, different electrical properties, different polarities, or different dopants for providing electrons or holes. For example, the first semiconductor layer 112 is an n-type semiconductor and the second semiconductor layer 116 is a p-type semiconductor. The active region 114 is formed between the first semiconductor layer 112 and the second semiconductor layer 116. Driven by a current, electrons and holes are combined in the active region 114 to convert electrical energy into optical energy for illumination. The wavelength of the light emitted by the light-emitting diode 100 or the semiconductor stack 110 can be adjusted by changing the physical properties and chemical composition of one or more layers in the semiconductor stack 110.

The material of the semiconductor stack 110 includes III-V semiconductor like $Al_xIn_yGa_{(1-x-y)}N$ or $Al_xIn_yGa_{(1-x-y)}P$, where $0 \leq x$, $y \leq 1$; $x+y \leq 1$. When the material of the semiconductor stack 110 includes AlInGaP, it emits red light having a wavelength between 610 nm and 650 nm or yellow light having a wavelength between 550 nm and 570 nm. When the material of the semiconductor stack 110 includes InGaN, it emits blue light or deep blue light having a wavelength between 400 nm and 490 nm or green light having a wavelength between 490 nm and 550 nm. When the material of the semiconductor stack 110 includes AlGaN, it emits UV light having a wavelength between 250 nm and 400 nm. The active region 114 can be a single heterostructure (SH), a double hetero-structure (DH), a double-side double hetero-structure (DDH), or a multi-quantum well (MQW). The material of the active region 114 can be i-type, p-type, or n-type.

Next, the semiconductor stack 110 is patterned in accordance with the mask pattern 102 shown in FIG. 1A. In FIG. 1A, the blank area 102b is the etching area where the second semiconductor layer 116, the active region 114, and parts of the first semiconductor layer 112 are to be removed. The reserve area 102p is the area within the semiconductor stack 110 that is not to be removed. For example, dry etching is performed from the upper surface of the second semiconductor layer 116 to form an upper surface of the first semiconductor layer 112 in the etching area. Therefore, as shown in FIG. 3, in the light-emitting diode 100 manufactured by the mask pattern in FIGS. 1A to 1D, a mesa 124 is formed corresponding to the reserve area 102p of the mask pattern 102; an exposed region 125 is formed corresponding to the etching area. The exposed region 125 includes the sidewall of the second semiconductor layer 116, the sidewall of the active region 114, the sidewall of the first semiconductor layer 112, and parts of the upper surface of the first semiconductor layer 112. FIG. 2 shows the edge 102e of the mesa 102 corresponding to the mask pattern 102, wherein the area outside the edge 102e is the exposed region 125. In addition, the exposed region 125 further includes recesses 102h.

Next, the transparent conductive layer 118 is formed on the semiconductor stack 110, as shown in FIGS. 2 and 3. In one embodiment, the transparent conductive layer 118 is formed on the semiconductor stack 110 and electrically connects to the second semiconductor layer 116 to laterally disperse current. The material of the transparent conductive layer 118 includes metal or transparent conductive oxide material. The metal can be a thin electrode layer with high transparency, and the transparent conductive oxide material is transparent to the light emitted from the active region 114, such as indium tin oxide (ITO), alumina zinc (AZO), gallium zinc oxide (GZO), indium zinc oxide (IZO), etc. Then, the mask pattern 104 in FIG. 1B is used to pattern the transparent conductive material by lithography and etching. With the mask pattern 104, a portion of the transparent conductive material corresponding to the reserve area 104p is left, and the other portion of the transparent conductive layer material corresponding to the blank area 104b is removed, as shown in FIGS. 2 and 3. FIG. 2 shows the edge 104e of the patterned transparent conductive layer 118. The transparent conductive layer 118 is located on the mesa 124 and does not cover the exposed region 125. The transparent conductive layer 118 has an opening exposing the second semiconductor layer 116. In one embodiment, as shown in FIG. 1B and FIG. 2, the transparent conductive layer 118 has an opening 118a. In one embodiment, as shown in FIGS. 1B and 2, the transparent conductive layer 118 has an opening 118b exposing the recesses 102h, the second semiconductor layer 116 around the recesses 102h, and the second semiconductor layer 116 between two adjacent recesses 102h so that the second semiconductor layer 116 between adjacent recesses 102h is not covered by the transparent semiconductor layer 118.

Next, the insulating layer 120 is formed on the transparent conductive layer 118. The insulating layer 120 has openings 120h, 120g, 120j, and 120r. For example, an insulating material, such as silicon oxide, silicon nitride, silicon oxynitride, titanium oxide, aluminum oxide, a combination thereof or a stack laminated by any of the above materials, is formed on the transparent conductive layer 118, The insulating material may be a single layer or a stack of multiple layers. Then, the mask pattern 106 shown in FIG. 1C is used to pattern the insulating material to form the insulating layer 120 by lithography and etching. The portion of the insulating material corresponding to the reserve area 106p of the mask pattern 106 is left and the other portion of the insulating material corresponding to the blank area 106b of the mask pattern 106 is removed. FIG. 2 and FIG. 3 show the patterned insulating layer 120. FIG. 2 exemplarily shows that the insulating layer 120 has openings 120h, 120g, 120j, 120r, and an edge 106e. As shown in FIGS. 2 and 3, the opening 120g corresponds to the position of the opening 118a of the transparent conductive layer 118, and the width of the opening 120g is larger than the width of the opening 118a of the transparent conductive layer, exposing the transparent conductive layer 118 and the second semiconductor layer 116. The openings 120h expose the transparent conductive layer 118. The openings 120j correspond to the recesses 102h and expose the first semiconductor layer 112 in the recesses 102h. The opening 120r exposes the first semiconductor layer 112 in the exposed region 125.

Next, the electrode layer 122 is formed on the insulating layer 120. The electrode layer 122 includes pads PDn and PDp and extensions EXTn and EXTp. In one embodiment, a conductive material is formed on the insulating layer 120 and then is patterned to form the electrode layer 122 by the mask pattern 108 shown in FIG. 1D. Conductive material includes metal such as Cr, Ti, Au, Al, Cu, Sn, Ni, Rh, Pt, an alloy thereof or a stack laminated by any of the above materials. The portion of the conductive material corresponding to the reserve area 108p of the mask pattern 108 is left and the other portion of the conductive material corresponding to the blank area 108b of the mask pattern 108 is removed. FIG. 2 shows the edge 108e of the electrode layer 122. As shown in FIG. 2, each of the pads PDn and PDp can be used for wire bonding in subsequent process. The two extensions EXTp extend from the pad PDp. The extension EXTn extends from the pad PDn toward the pad PDp and is located between the two extensions EXTp. The arrangement of the electrode layer of the light-emitting diode of the present application is not limited to that shown in this embodiment. For example, the number, the position, and the area of the pads and the extensions can be adjusted in accordance with the light-emitting area and the operating current of the light-emitting diode.

In one embodiment, as shown in FIG. 2, the portion of the extension EXTp corresponding to the opening 120h has a width wider than that of the opening 120h, so that the extension EXTp covers the entire opening 120h. In FIG. 3, the extension EXTp contacts and electrically connects to the transparent conductive layer 118 through the opening 120h.

In this embodiment, the pad PDp and the extension EXTp serve as the anode of the light-emitting diode 100. As shown in FIGS. 2 and 3, the pad PDp passes through the opening 120g of the insulating layer 120 and the opening 118a of the transparent conductive layer opening, contacts and electrically connects to the second semiconductor layer 116. The extension EXTp discontinuously contacts the transparent conductive layer 118 through the openings 120h that are disposed with intervals, so that the current flowing within the second semiconductor layer 116 can be uniformly distributed so as to increase the efficiency of the light-emitting diode 100.

Furthermore, the pad PDp contacts the second semiconductor layer 116 through the opening 120g of the insulating layer 120 and the opening 118a of the transparent conductive layer 118, which can increase the adhesion between the electrode layer 122 and the second semiconductor layer 116. The pad PDp can be prevented from peeling off when pulled by the stress of the wires in the subsequent wire bonding process.

The pad PDn and the extension EXTn serve as the cathode of the light-emitting diode 100, contact and electrically connect to the first semiconductor layer 112 through openings 120j and 120r of the insulating layer 120 and the recesses 102h. The extension EXTn discontinuously contacts the first semiconductor layer 112 through the opening 120j of the insulating layer 120 and the recesses 102h that are disposed with intervals, so that the current flowing within the first semiconductor layer 112 can be uniformly distributed so as to increase the efficiency of the light-emitting diode 100.

In one embodiment, as shown in FIG. 2 and FIG. 3, the opening 120r has a ring shape in a top view. The portion of the insulating layer 120 under the pad PDn forms a current blocking region. The pad PDn contacts the first semiconductor layer 112 through the ring-shaped opening 120r. In this way, current can be forced to flow into the extension EXTn. Current crowding can be avoided by preventing most of the current from directly injecting into the semiconductor stack 110 through the pad PDn.

In one embodiment, the extension EXTp covers the entire opening 120h, which ensures that the extension EXTp contacts the transparent conductive layer 118 even if the mask pattern 108 and the mask pattern 106 are shifted during the manufacturing process.

In addition, as shown in FIG. 3, the side wall of the opening 120h is an inclined surface in a cross-sectional view. The included angle between the bottom surface of the insulating layer 120 and the side wall of the opening 120h is an acute angle, and the angle is between 20-70 degrees. In this way, the extension EXTp is disposed on the opening 120h and conformally covers the insulating layer 120, and the extension EXTp can be prevented from peeling from the insulation layer 120 when it extends up and down due to the thickness of the insulation layer 120. Similarly, the side walls of the openings 120g, 120j, 120r and the side walls of the openings of the insulating layer 120 in this embodiment and in any other embodiments of the present application can be inclined in cross-sectional views.

Compared with conventional art, the manufacturing method of the light-emitting diode 100 and the mask patterns for manufacturing the light-emitting diode 100 in accordance with the first embodiment of the present application can simplify the manufacturing process and reduce costs.

Second Embodiment

Figure 4A:
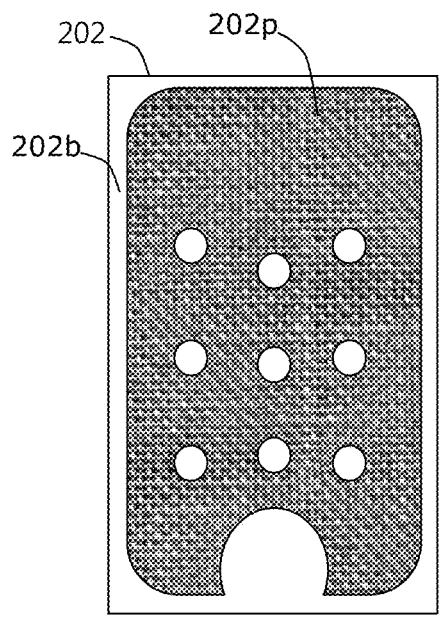
FIGS. 4A-4D show mask patterns for manufacturing a light-emitting diode 200 in accordance with a second embodiment of the present application.
Figure 4B:
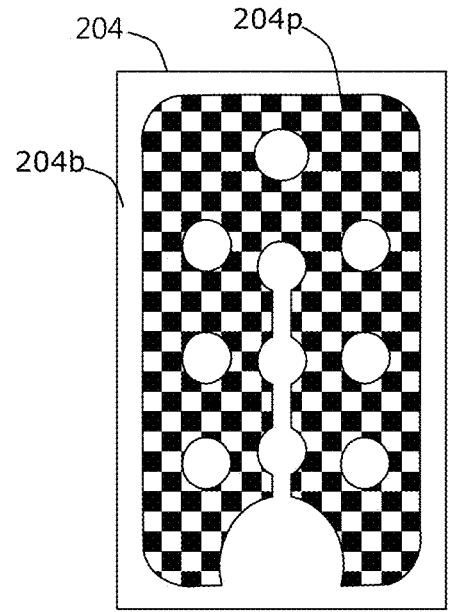

FIGS. 4A to 4D show the mask patterns for manufacturing a light-emitting diode 200 in accordance with to the second embodiment of the present application, which are respectively labeled as mask pattern 202, mask pattern 204, mask pattern 206, and mask pattern 208. Same as the first embodiment, the mask patterns 202, 204, 206 and 208 are used to define the mesa, the transparent conductive layer, the insulating layer and the electrode layer, respectively. FIG. 5 shows a top view of the light-emitting diode 200 manufactured by the above mask patterns. FIG. 6 shows a cross-sectional view of the light-emitting diode 200 taken along the VI-VI line in FIG. 6.

In the second embodiment, the similarities between the second embodiment and the first embodiment can be understood through the disclosure of the first embodiment and will not be repeated.

Similar to the first embodiment, the light-emitting diode 200 shown in FIG. 6 includes a semiconductor stack 210, a transparent conductive layer 218, an insulating layer 220, and an electrode layer 222. In the semiconductor stack 210, a first semiconductor layer 212, an active region 214, and a second semiconductor layer 216 are stacked in this order.

As shown in FIGS. 4A-4D, FIG. 5 and FIG. 6, the blank area 202b is the etching area where the second semiconductor layer 216, the active region 214, and part of the first semiconductor layer 212 are to be removed so that the exposed region 225 is formed. The reserve area 202p is the area within the semiconductor stack 210 that is not to be removed so that the mesa 224 is formed. With the mask pattern 204, a portion of the transparent conductive layer 218 corresponding to the reserve area 204p is left, and the other portion of the transparent conductive layer 218 corresponding to the blank area 204b is removed. With the mask pattern 206, a portion of the insulating layer 220 corresponding to the reserve area 206p is left, and the other portion of the insulating layer 220 corresponding to the blank area 206b is removed. With the mask pattern 208, a portion of the electrode layer 222 corresponding to the reserve area 208p is left, and the other portion of the electrode layer 222 corresponding to the blank area 208b is removed.

FIG. 5 shows the edge 202e of the mesa, the edge 204e of the transparent conductive layer 218, the edge 206e of the insulating layer 220, and the edge 208e of the electrode layer 222. The two extension EXTp connects to both sides of the pad PDp, and the extension EXTn extends from the pad PDn.

FIGS. 5 and 6 show the recesses 202h defined by the mask pattern 202. Being different from the first embodiment, the light-emitting diode 200 further includes a plurality of recesses 202k under the extensions EXTp. Each of the recesses 202h and 202k has a side wall 264 and a bottom 262. The sidewall 264 exposes the second semiconductor layer 216, the active region 214, and a portion of the first semiconductor layer 212. The bottom 262 exposes the first semiconductor layer 212.

The transparent conductive layer 218 which is formed in accordance with the mask pattern 204 is shown in FIG. 5 and FIG. 6. FIG. 5 shows the edge 204e of the transparent conductive layer 218. The transparent conductive layer 218 is located on the mesa 224 and does not cover the exposed region 225. The transparent conductive layer 218 has an opening. In one embodiment, as shown in FIG. 4B and FIG. 5, the transparent conductive layer 218 includes an opening 218a to expose the second semiconductor layer 216. In one embodiment, as shown in FIG. 4B and FIG. 5, the transparent conductive layer 218 has an opening 218b exposing the second semiconductor layer 216 around the recesses 202h and the second semiconductor layer 216 between two adjacent recesses 202h. The second semiconductor layer 216 between adjacent recesses 202h is not covered by the transparent semiconductor layer 218. Being different from the first embodiment, the transparent conductive layer 218 of the light-emitting diode 200 further includes an opening 218j exposing the recesses 202k.

The insulating layer 220 which is formed in accordance with the mask pattern 206 is shown in FIGS. 5 and 6. The insulating layer 220 includes openings 220h, 220g, 220j, 220r, and an edge 206e. Being similar with the light-emitting diode 100 in the first embodiment, the opening 220g corresponds to the position of the opening 218a of the transparent conductive layer 218, and the width of the opening 220g is larger than the width of the opening 218a of the transparent conductive layer, exposing the transparent conductive layer 218 and the second semiconductor layer 216. The openings 220h correspond to the position of the recesses 202k and expose the transparent conductive layer 218. The openings 220j corresponds to the recesses 202h and expose the first semiconductor layer 212 in the recesses 202h. The opening 220r exposes the first semiconductor layer 212 in the exposed region 225.

Figure 4C:
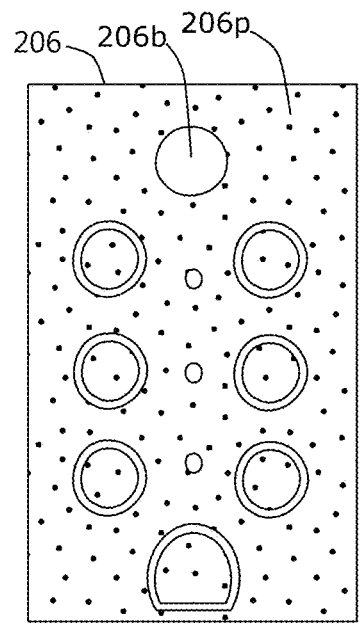
Figure 4D:
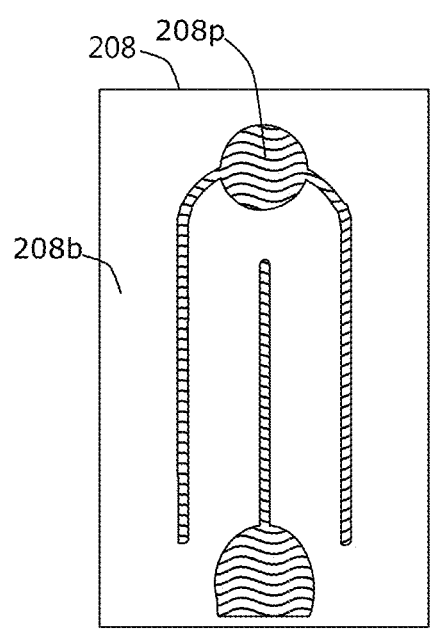
Figure 5:
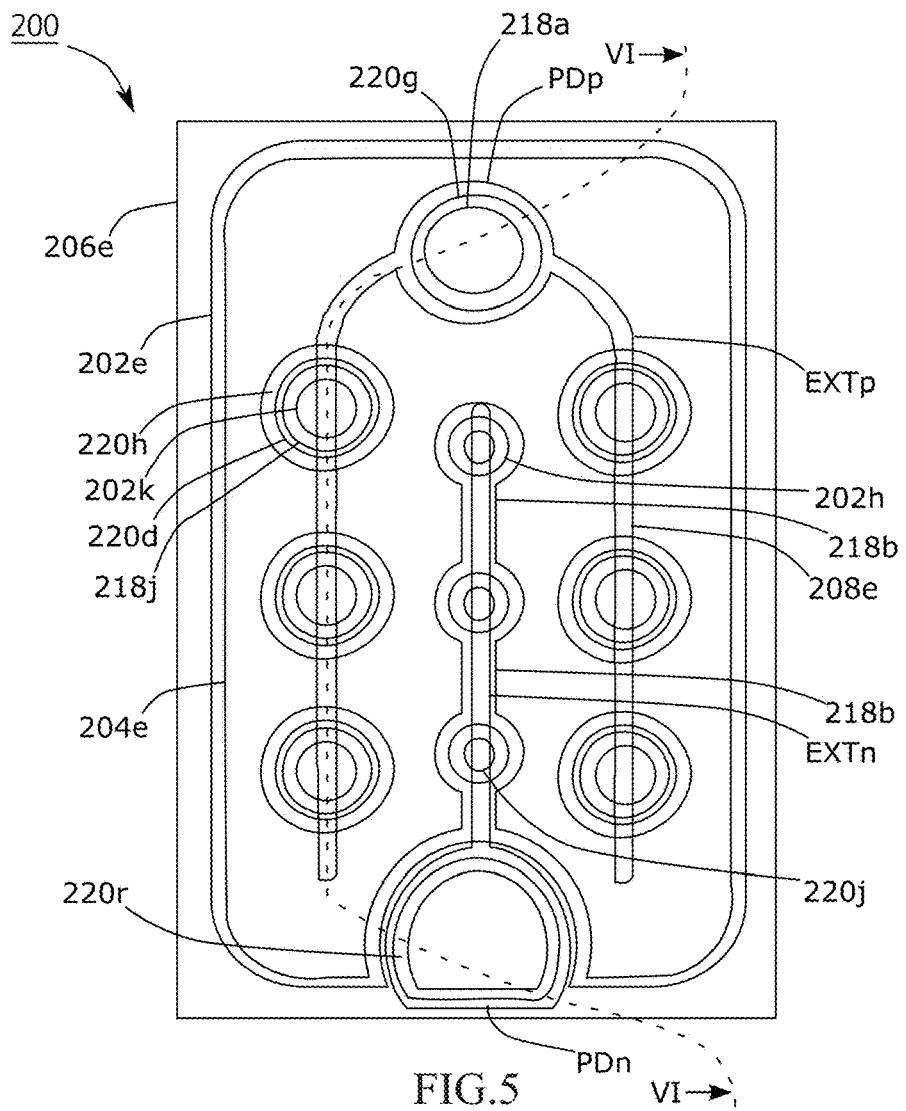
FIG. 5 shows a top view of the light-emitting diode 200 in accordance with the second embodiment of the present application.
Figure 6:
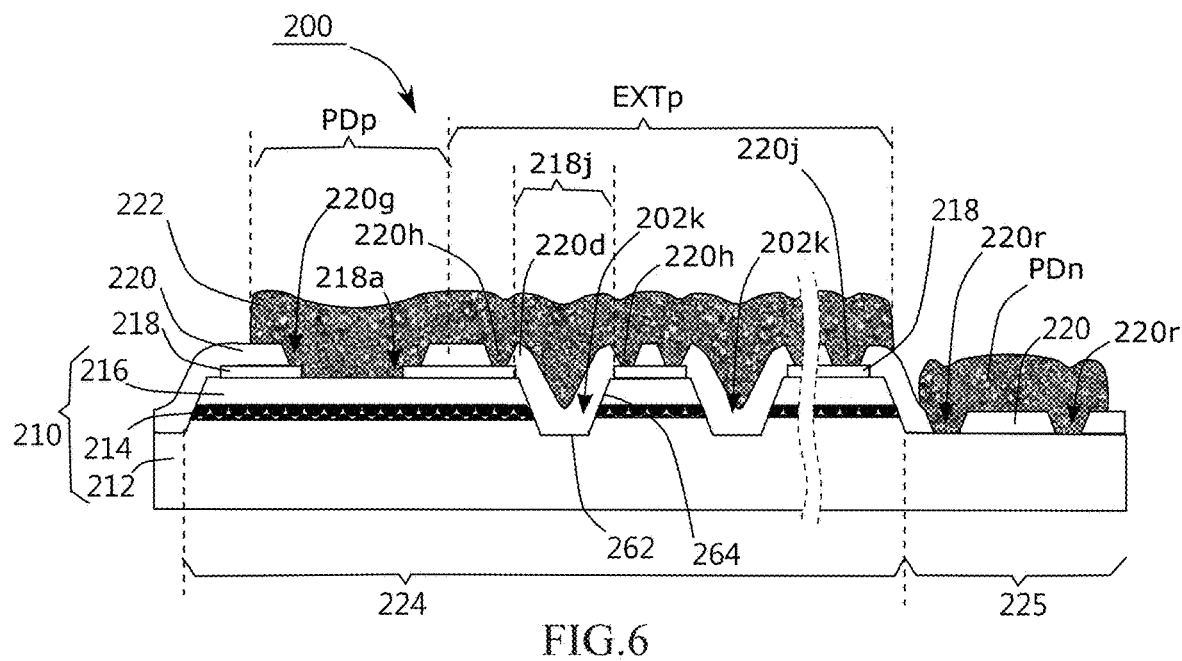
FIG. 6 shows a cross-sectional view of the light-emitting diode 200.

As shown in FIG. 4C and FIG. 5, compared to the light-emitting diode 100 in the first embodiment and the mask patterns used for manufacturing the light-emitting diode 100, the insulating layer 220 can be patterned further to form the islands 220d in accordance with the mask pattern 206. The island 220d and an edge of the insulating layer 220 around the island 220d constitute a ring-shaped opening 220h, which is adjacent to the edge of the recess 202k. The island 220d covers the entire recess 202k. As shown in FIG. 5 and FIG. 6, the extension EXTp partially overlaps the recess 202k. The extension EXTp contacts the transparent conductive layer 218 through the ring-shaped opening 220h and electrically connects to the second semiconductor layer 216. Since the transparent conductive layer 218 is not formed in the recess 202k and the recess 202k is covered by the island 220d, the extension EXTp does not electrically connect to the first semiconductor layer 212 through the recess 202k.

When the electrode layer 222 is an opaque metal material, light in parts of the semiconductor stack 210 under the extension EXTp may be shielded by the extension EXTp. In the present embodiment, the second semiconductor layer 216 and the active region 214 in the parts of the semiconductor stack 210 under the extension EXTp are removed to form the recesses 202k. Current is forced to diffuse into the semiconductor stack 210 in other parts of the semiconductor stack 210 that are not shielded, so that electrons and holes are combined in the un-shielded parts and generate light. Consequently, less light is shielded and the brightness of the light emitting diode 200 is improved. Furthermore, due to the incline side wall of the recess 202k or that incorporated with the insulating layer 220 formed thereon, light emitted from the active region 214 can be reflected and changes its direction so that the light extraction efficiency of the light-emitting diode 200 is improved.

Third Embodiment

Figure 7:
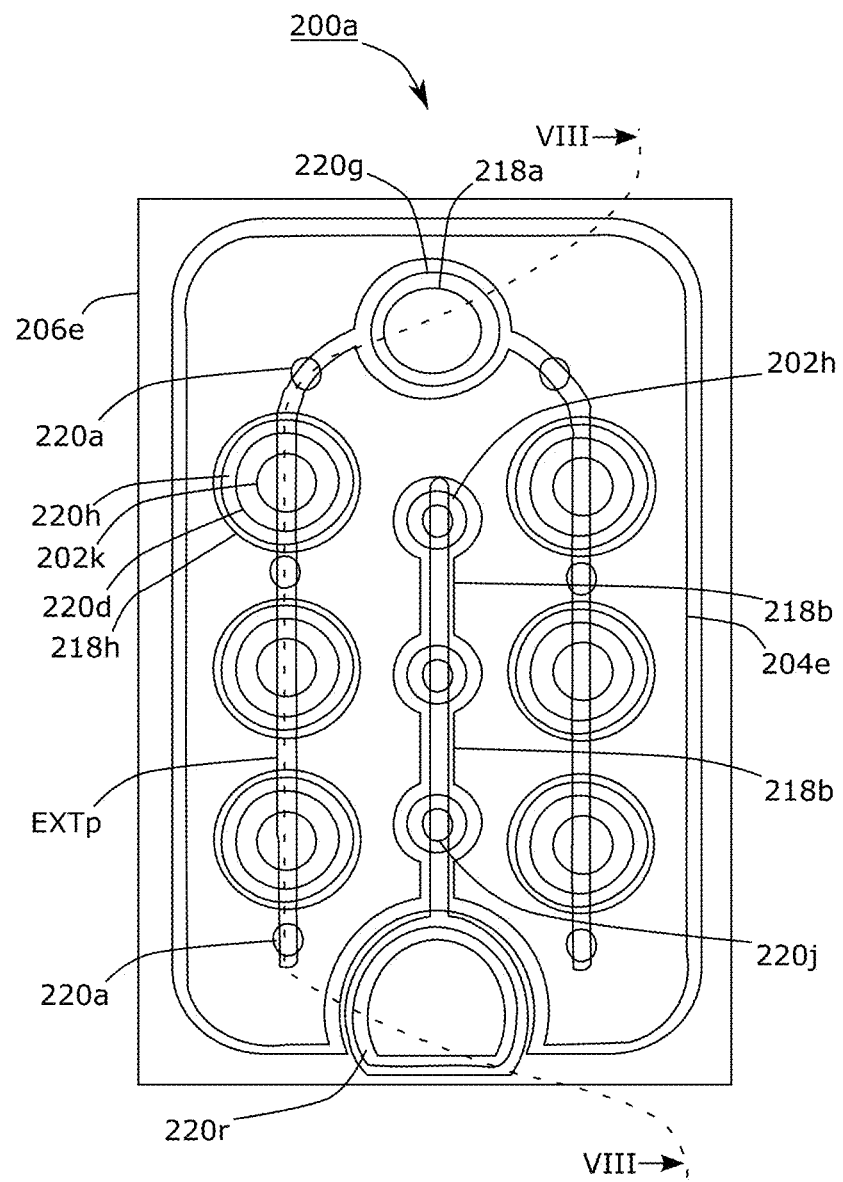
FIG. 7 shows a top view of a light-emitting diode 200a in accordance with a third embodiment of the present application.
Figure 8:
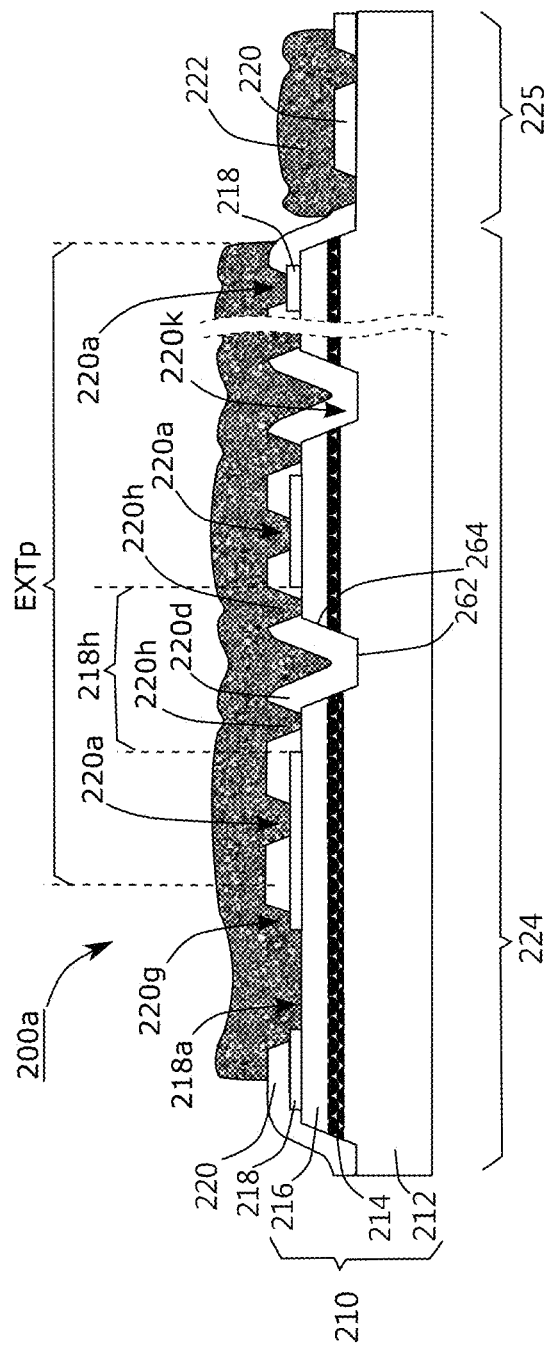

FIG. 7 shows a top view of a light-emitting diode 200a. FIG. 8 shows a cross-sectional view of the light-emitting diode 200a taken along the VIII-VIII line in FIG. 7. The light-emitting diode 200a is manufactured by the mask patterns 202 and 208, but the mask pattern 204 used to define the transparent conductive layer 218 and the mask pattern 206 used to define the insulating layer 220 are different from that shown in FIGS. 4B and 4C.

As shown in FIG. 7, the transparent conductive layer 218 defined by the mask pattern 204 includes a plurality of openings 218h, and both the ring-shaped opening 220h and the recess 202k completely fall into the opening 218h, which is different form the light-emitting diode 200a shown in FIG. 5 with the ring-shaped opening 220h not falling into the opening 218j and the recess 202k completely falling into the opening 218j. As shown in FIG. 8, the extension EXTp does not contact the transparent conductive layer 218 through the ring-shaped opening 220h. The extension EXTp contacts the second semiconductor layer 216 through the ring-shaped opening 220h.

Compared with FIG. 5, the insulating layer 200 defined by the mask pattern 206 shown in FIG. 7 further includes openings 220a that expose the transparent conductive layer 218. Therefore, in FIG. 8, the extension EXTp can contact the transparent conductive layer 218 through the openings 220a.

Fourth Embodiment

Figure 10:
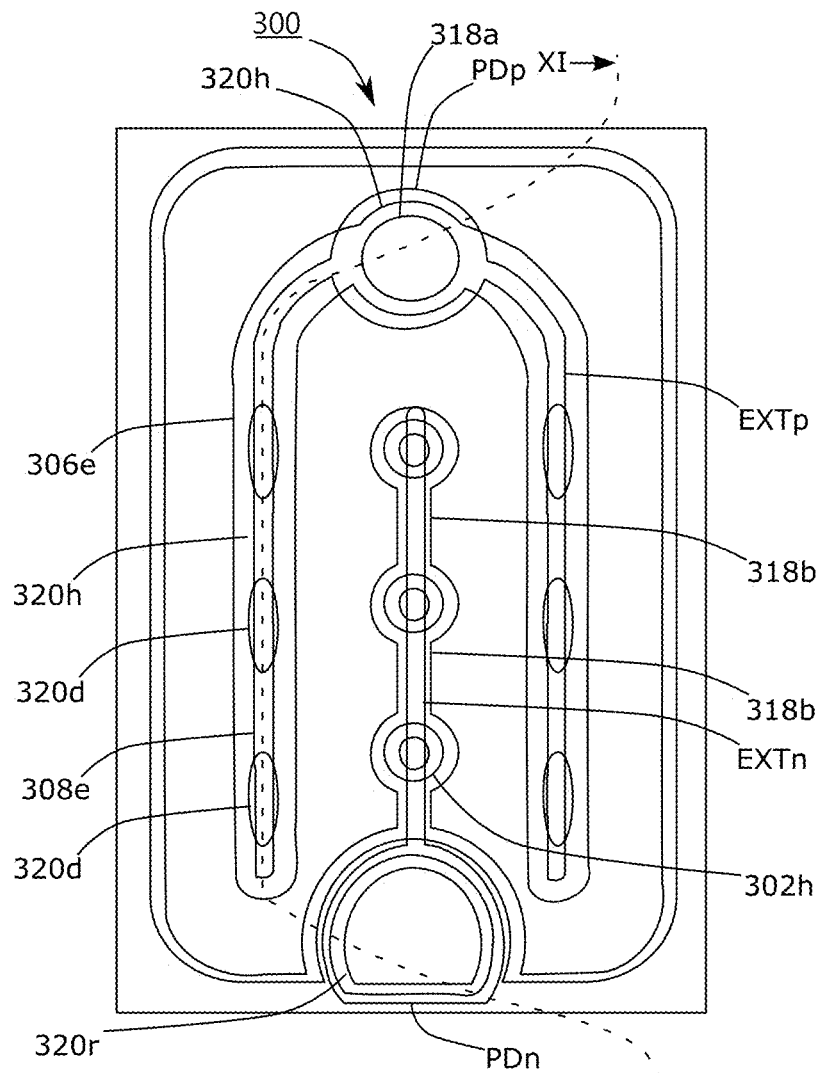
FIG. 10 shows a top view of the light-emitting diode 300 in accordance with the fourth embodiment of the present application.
Figure 11:
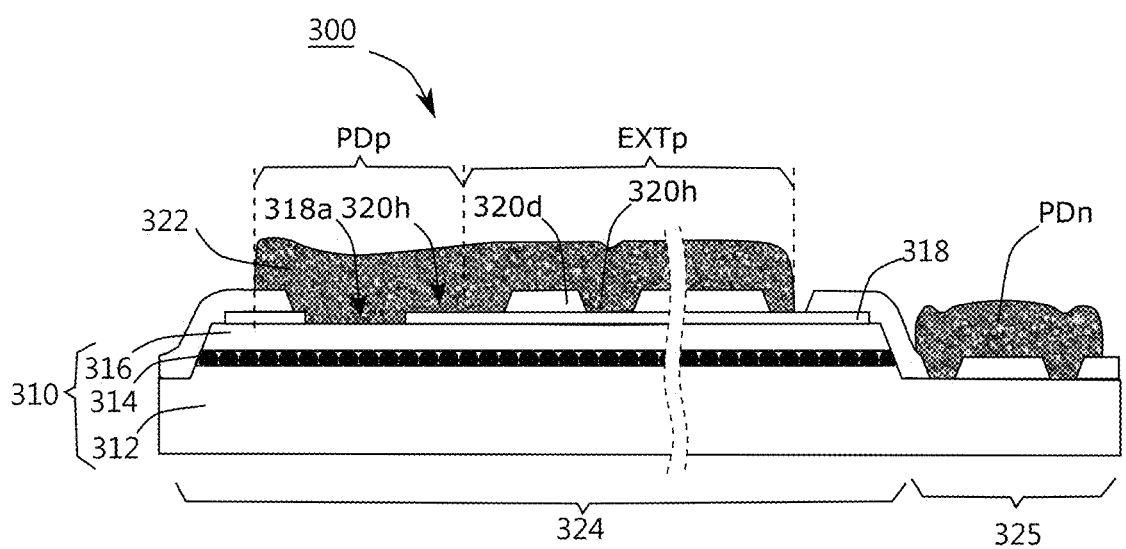
FIG. 11 shows a cross-sectional view of the light-emitting diode 300.

FIGS. 9A to 9D show the mask patterns for manufacturing a light-emitting diode 300 in accordance with to the fourth embodiment of the present application, which are respectively labeled as mask pattern 302, mask pattern 304, mask pattern 306, and mask pattern 308. The mask patterns 302, 304, 306 and 308 are used to define the mesa, the transparent conductive layer, the insulating layer and the electrode layer, respectively. FIG. 10 shows a top view of the light-emitting diode 300 manufactured by the above mask patterns. FIG. 11 shows a cross-sectional view of the light-emitting diode 300 taken along the XI-XI line in FIG. 10.

Similar with the above-mentioned embodiments, the light-emitting diode 300 shown in FIG. 10 includes a semiconductor stack 310, a transparent conductive layer 318, an insulating layer 320, and an electrode layer 322. In the semiconductor stack 310, a first semiconductor layer 312, an active region 314, and a second semiconductor layer 316 are stacked in this order.

As shown in FIGS. 9A-9D, FIG. 10 and FIG. 11, the blank area 302b is the etching area where the second semiconductor layer 316, the active region 314, and part of the first semiconductor layer 312 are to be removed so that the exposed region 325 is formed. The reserve area 302p is the area within the semiconductor stack 310 that is not to be removed so that the mesa 324 is formed. With the mask pattern 304, a portion of the transparent conductive layer 318 corresponding to the reserve area 304p is left, and the other portion of the transparent conductive layer 318 corresponding to the blank area 304b is removed. With the mask pattern 306, a portion of the insulating layer 320 corresponding to the reserve area 306p is left, and the other portion of the insulating layer 320 corresponding to the blank area 306b is removed. With the mask pattern 308, a portion of the electrode layer 322 corresponding to the reserve area 308p is left, and the other portion of the electrode layer 322 corresponding to the blank area 308b is removed.

In the fourth embodiment, the similarities between the fourth embodiment and the above-mentioned embodiments can be understood through the disclosures of the above-mentioned embodiments and will not be repeated. For example, the mask patterns 302 and 304 are the same as the mask patterns 102 and 104 in the first embodiment, respectively. Therefore, being similar with the light-emitting diode 100, the light-emitting diode 300 includes the recesses 302h in the semiconductor stack 310 and the openings 318a and 318b in the transparent conductive layer 218. The mask pattern 308 is the same as the mask pattern 208 in the second embodiment.

As shown in FIG. 10, the insulating layer 320 defined by the mask pattern 306 includes an opening 320h and an opening 320r located under the pad PDn. Different from the above-mentioned embodiments having the plurality of separated openings of the insulating layer under the extension EXTp, the light-emitting diode 300 includes the single and continuous opening 320h of the insulating layer 320 under the extension EXTp, and a plurality of islands 320d is located in the opening 320h. The islands 320d are formed by patterning the insulating layer 320. The extension EXTp partially overlaps the islands 320d. As shown in FIG. 11, the extension EXTp contacts the transparent conductive layer 318 through the opening 320h. The islands 320d can make the current distribution in the transparent conductive layer 318 more uniform.

Fifth Embodiment

In each of the first embodiment to the fourth embodiment, four mask patterns are used to define the mesa, the transparent conductive layer, the insulating layer, and the electrode layer, respectively. In the fifth embodiment, the mask pattern used to define the mesa is also used to define the transparent conductive layer. That is, three mask patterns are used for manufacturing the light-emitting diode 400 in accordance with the fifth embodiment.

Figure 13:
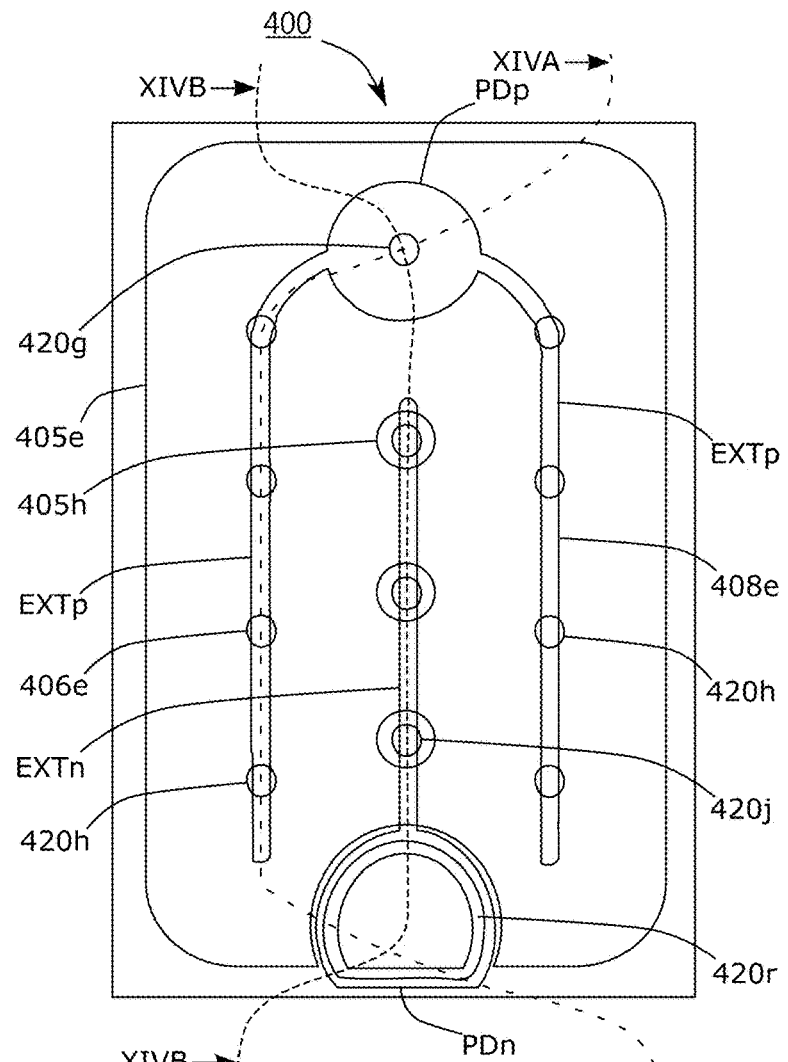
FIG. 13 shows a top view of the light-emitting diode 400 in accordance with the fifth embodiment of the present application.
Figure 14A:
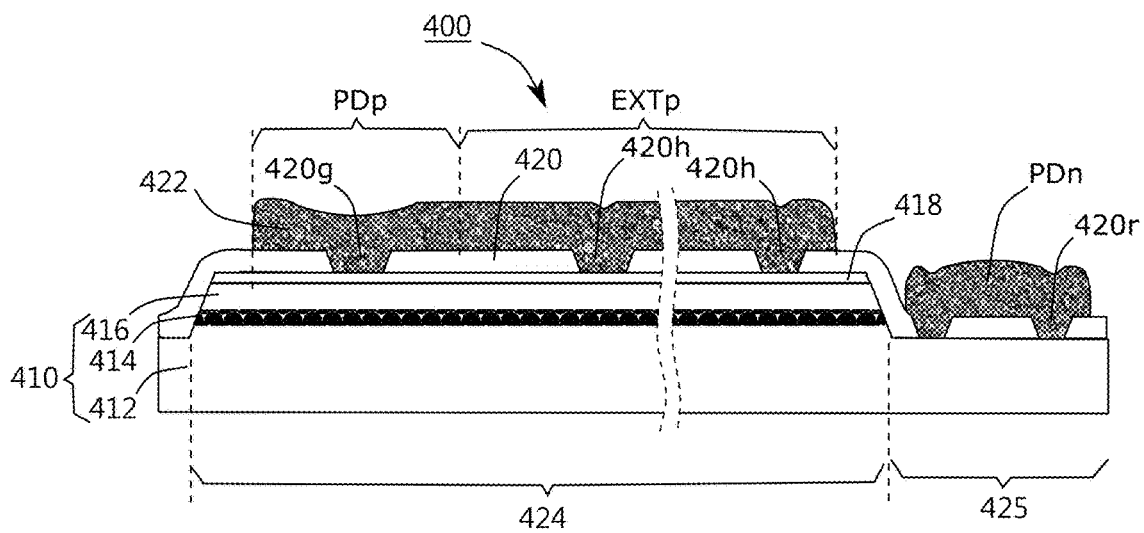
FIGS. 14A and 14B show two cross-sectional views of the light-emitting diode 400.
Figure 14B:
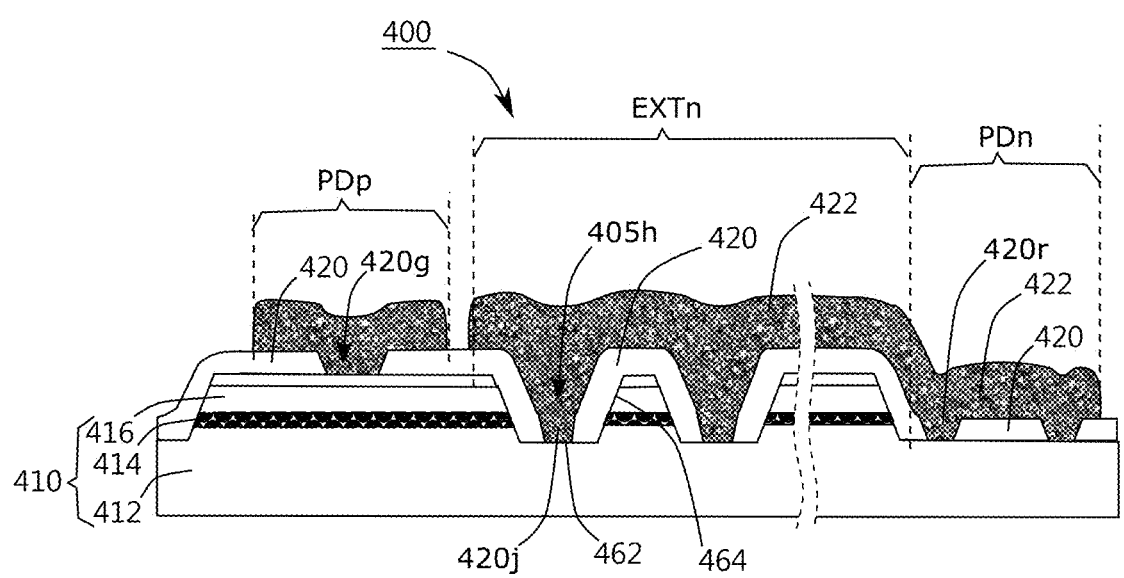

FIGS. 12A to 12C show the mask patterns for manufacturing the light-emitting diode 400 in accordance with to the fifth embodiment of the present application, which are respectively labeled as mask pattern 405, mask pattern 406 and mask pattern 408. FIG. 13 shows a top view of the light-emitting diode 400 manufactured by the above mask patterns. FIGS. 14A and 14B show cross-sectional views of the light-emitting diode 400 taken along the XIVA-XIVA line and the XIVB-XIVB in FIG. 13, respectively.

In the fifth embodiment, the similarities between the fifth embodiment and the above-mentioned embodiments can be understood through the disclosures of the above-mentioned embodiments and will not be repeated.

As shown in FIG. 14A and FIG. 14B, the light-emitting diode 400 includes a semiconductor stack 410, a transparent conductive layer 418, an insulating layer 420, and an electrode layer 422. In the semiconductor stack 410, a first semiconductor layer 412, an active region 414, and a second semiconductor layer 416 are stacked in this order.

Similar with the above-mentioned embodiments, the semiconductor stack 410 and the transparent conductive layer 418 are sequentially formed on the substrate (not shown). Next, the mask pattern 405 is used to simultaneously pattern the semiconductor stack 410 and the transparent conductive layer 418. As shown in FIG. 12A and FIG. 14A, the blank area 405b is the etching area where the transparent conductive layer 418, the second semiconductor layer 416, the active region 414, and parts of the first semiconductor layer 412 are to be removed so that the exposed region 425 is formed. The exposed region 425 includes the recesses 405h. The reserve area 405p is the area within the transparent conductive layer 418 and the semiconductor stack 410 that are not to be removed so that the mesa 424 is formed and the transparent conductive layer 418 is on the mesa 424. FIG. 13 shows the edge 405e of the mesa 424 and the transparent conductive layer 105 formed by the mask pattern 405. In one embodiment, the transparent conductive layer 418 may be over-etched, and the edge thereof may shrink behind the edge of the mesa 424 due to different etching conditions. That is, the edge of the transparent conductive layer 418 is enclosed by the edge of the mesa 424. In one embodiment, the distance between the edge 405e of the mesa 424 and the edge of the transparent conductive layer 418 is less than 3 μm. The recess 405h shown in FIG. 13 exposes the first semiconductor layer 412. As shown in FIG. 14B, the recess 405h includes side wall 464 and a bottom 462. The side wall 464 is composed of side surfaces of the transparent conductive layer 418, the second semiconductor layer 416, the active region 414, and a portion of the first semiconductor layer 412 that are exposed by the recess 405h. The bottom 462 is composed of the upper surface of the first semiconductor layer 412 exposed by the recess 405h.

The insulating layer 420 is then formed on the transparent conductive layer 118 and is patterned by the mask pattern 406 shown in FIG. 12B to have openings 420h, 420j, 420g, and the ring-shaped opening 420r. With the mask pattern 406, a portion of the insulating layer 420 corresponding to the reserve area 406p is left, and the other portion of the insulating layer 420 corresponding to the blank area 406b is removed. FIG. 13 shows the edge 406e of the patterned insulating layer 420. As shown in FIG. 14A, the opening 420g is located under the pad PDp, the opening 420h is located under the extension EXTp, and both the openings 420h and 420g expose the transparent conductive layer 418. Being similar with the first embodiment, the ring-shaped opening 420r exposes the first semiconductor layer 412, and the openings 420j are located at the position of the recesses 405h, exposing the first semiconductor layer 412 in the recesses 405h.

The electrode layer 422 is formed on the insulating layer 420 and is patterned by the mask pattern 408 to have the pads PDn and PDp and extensions EXTp and EXTn. With the mask pattern 408, a portion of the electrode layer 222 corresponding to the reserve area 408p is left, and the other portion of the electrode layer 422 corresponding to the blank area 408b is removed. FIG. 13 shows the edge 408e of the patterned electrode layer 422. The two extensions EXTp connect to two sides of the pad PDp, and the extension EXTn connects to the side of the pad PDn facing the pad PDp.

As shown in FIG. 13, the pad PDp overlaps the opening 420g, the extension EXTp partially overlaps the opening 420h, and the extension EXTn partially overlaps the opening 420j.

The pad PDp and the extensions EXTp serve as the anode of the light-emitting diode 400 and contact the transparent conductive layer 418 through the openings 420g and 420h, respectively.

The pad PDn and the extension EXTn serve as the cathode of the light-emitting diode 400 and directly contact the first semiconductor layer 412 through the openings 420j in the recesses 405h and the ring-shaped opening 420r.

In the fifth embodiment, only the three mask patterns 405, 406, and 408 are used to manufacture the light-emitting diode 400, which simplifies the manufacturing process and lowers the manufacturing cost.

In another embodiment, the extensions EXTp of the light-emitting diode 400 can be modified as that in the first embodiment. That is, the portion of the extension EXTp corresponding to the opening 420h has a width wider than that of the opening 420h so that the extension EXTp covers the entire opening 420h, which ensures that the extension EXTp contacts the transparent conductive layer 418 in the opening 420h. In another embodiment, the insulating layer 420 can be modified to include the island 220d and the ring-shaped opening 220h as described in the second embodiment.

Sixth Embodiment

Figure 15A:
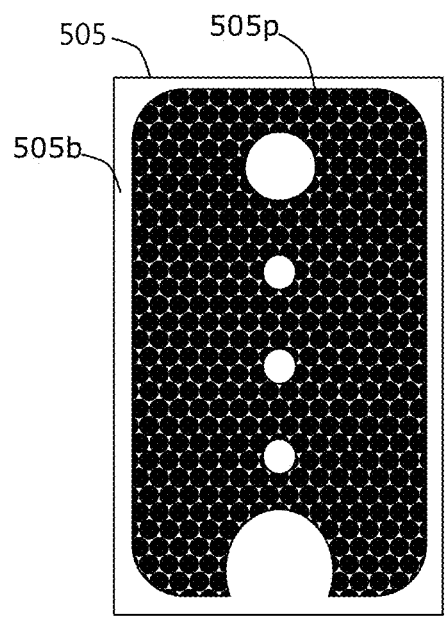
FIGS. 15A-15C show mask patterns for manufacturing a light-emitting diode 500 in accordance with a sixth embodiment of the present application.
Figure 15B:
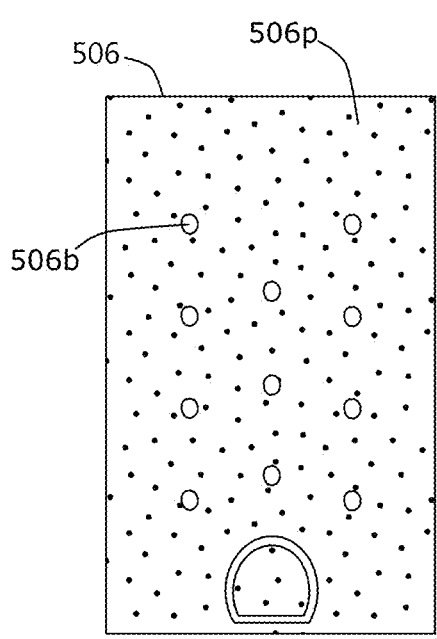
Figure 15C:
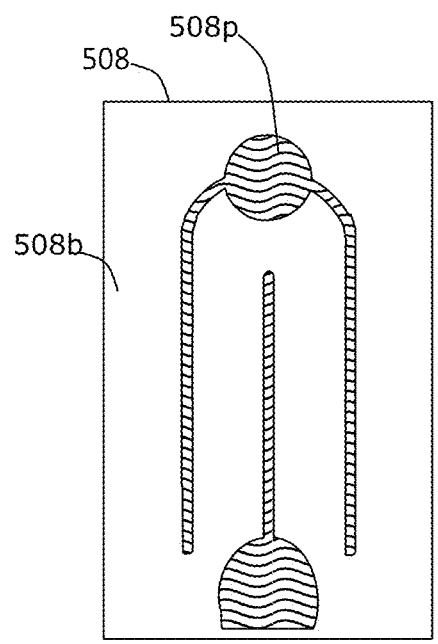
Figure 16:
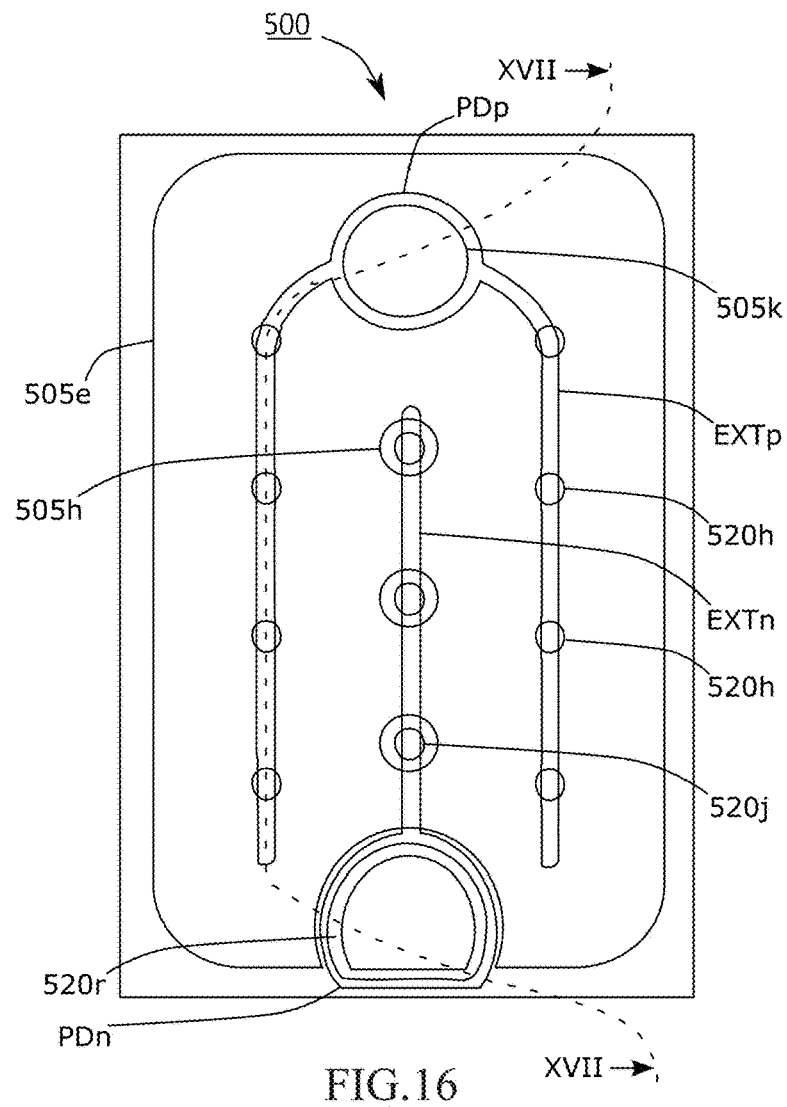
FIG. 16 shows a top view of the light-emitting diode 500 in accordance with the sixth embodiment of the present application.
Figure 17:
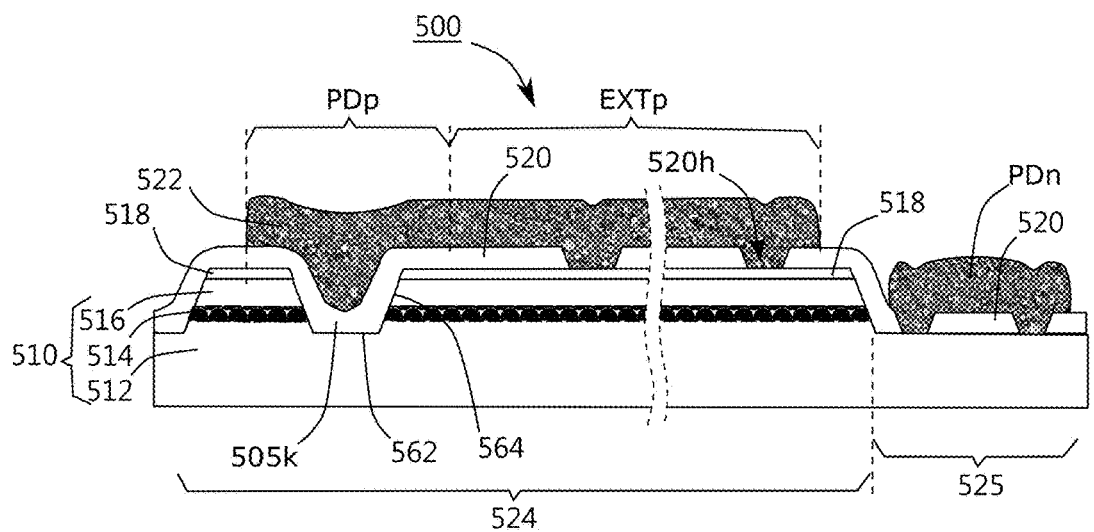
FIG. 17 shows a cross-sectional view of the light-emitting diode 500.

FIGS. 15A to 15C show the mask patterns for manufacturing a light-emitting diode 500 in accordance with to the sixth embodiment of the present application. The mask patterns are labeled as mask pattern 505, mask pattern 506, and mask pattern 508 which are used to define the mesa and the transparent conductive layer, the insulating layer, and the electrode layer, respectively. The mask patterns 505, 506 and 508 include black areas 505b, 506b and 508b and reserve areas 505p, 506p and 508p, respectively. FIG. 16 shows a top view of the light-emitting diode 500 manufactured by the above mask patterns. FIG. 17 shows cross-sectional views of the light-emitting diode 500 taken along the XVII-XVII line in FIG. 16. Similar with the fifth embodiment, the light-emitting diode 500 is manufactured by three mask patterns.

In the sixth embodiment, the similarities between the sixth embodiment and the fifth embodiment can be understood through the disclosures of the fifth embodiment and will not be repeated. The openings 520h are located under the extensions EXTp and expose the transparent conductive layer 518. Like the opening 120r in the first embodiment, the ring-shaped opening 520r exposes the first semiconductor layer 512, and the openings 520j are located at the position of the recesses 505h, exposing the first semiconductor layer 512 in the recesses 505h.

As shown in FIG. 15A and FIG. 16, the semiconductor stack 510 of the light-emitting diode 500 includes the mesa 524, the exposed region 525, the edge 505e of the mesa 505 and the recesses 505h that are defined by the mask pattern 505. In addition, unlike the fifth embodiment, the semiconductor stack 510 further includes a recess 505k located under the pad PDp. Each of the recesses 505k and 505h includes a side wall 564 and a bottom 562. As shown in FIG. 17, the side wall 564 is composed of side surfaces of the transparent conductive layer 518, the second semiconductor layer 516, and the active region 514 that are exposed by the recess 505k or 505h. The bottom 562 is composed of the upper surface of the first semiconductor layer 512 exposed by the recess 505k or 505h.

The recess 505k overlaps with the pad PDp. As shown in FIG. 15 and FIG. 16, the recess 505k is located within the area of the pad PDp. Unlike the fifth embodiment, the insulating layer 520 covers the bottom 562 and the sidewall 564 of the recess 505k so that the pad PDp does not contact the first semiconductor layer 512 in the bottom 562 of the recess 505k.

The recess 505k can increase the contact area between the pad PDp and the insulating layer 520 and the adhesion of the electrode layer 522. Consequently, the pad PDp can be prevented from peeling off when pulled by the stress of the wires in the subsequent wire bonding process. In another embodiment, a plurality of recesses 505k can be provided in the semiconductor stack 510 under the pad PDp, so that the electrode layer 522 is more firmly adhered to the insulating layer 520.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting diode, comprising:
   a semiconductor stack, comprising a first semiconductor layer, an active region, and a second semiconductor layer;
   a conductive layer formed on the semiconductor stack and electrically connected to the second semiconductor layer;
   an insulating layer formed on the conductive layer, comprising a plurality of first openings;
   a first electrode formed on the insulating layer, electrically connected to the first semiconductor layer; and
   a second electrode formed on the insulating layer, comprising a second pad and a second extension connecting the second pad and electrically connected to the conductive layer,
   wherein in a plan view:
      the second extension comprises a section extending along a first direction;
      the section comprises a node part disposed on one of the plurality of first openings and a linking part linking the node part;
      the node part comprises a first width along a second direction perpendicular with the first direction, the one of the plurality of first openings comprises a second width along the second direction, and the linking part comprises a third width along the second direction; and
      the first width is larger than both the second width and the third width.

2. The light-emitting diode of claim 1, wherein the conductive layer comprises a second opening exposing the second semiconductor layer.

3. The light-emitting diode of claim 2, wherein the insulating layer further comprises a third opening overlapping the second opening and the second pad contacts the second semiconductor layer through the second opening and the third opening.

4. The light-emitting diode of claim 2, further comprising a plurality of recesses formed in the semiconductor stack, wherein each of the recesses comprises a side wall and a bottom, and wherein the side wall exposes the second semiconductor layer and the active region and the bottom exposes the first semiconductor layer, and
   wherein the conductive layer comprises a fourth opening exposing the plurality of recesses and parts of the second semiconductor layer between two adjacent recesses of the plurality of recesses.

5. The light-emitting diode of claim 4, wherein:
   the insulating layer further comprises a plurality of fifth openings exposing the bottoms of the plurality of recesses; and
   the first electrode further comprising a first extension laterally extending from the first pad, and the first extension contacts the bottom of each of the plurality of recesses through the plurality of fifth openings.

6. The light-emitting diode of claim 1, wherein in the plan view, the first width is smaller than a width of the second pad.

7. The light-emitting diode of claim 1, wherein the section comprises a plurality of the linking parts and a plurality of the node parts, and
   wherein one of the plurality of linking parts connects the second pad and one of the plurality of node parts or one of the plurality of linking parts connects two of the plurality of node parts.

8. The light-emitting diode of claim 1, wherein the insulating layer further comprises a third opening and the second pad contacts the conductive layer through the third opening.

9. A light-emitting diode, comprising:
   a semiconductor stack, comprising a first semiconductor layer, an active region, a second semiconductor layer and a recess formed in the semiconductor stack, wherein the recess comprises a side wall and a bottom, and wherein the side wall comprises sidewalls of the second semiconductor layer and the active region and the bottom comprises an upper surface of the first semiconductor layer;
   a conductive layer formed on the semiconductor stack and electrically connecting the second semiconductor layer;
   an insulating layer formed on the conductive layer, comprising a first opening on the second semiconductor layer and an insulating island formed in the first opening and covering the recess;
   a first electrode formed on the insulating layer, electrically connected to the first semiconductor layer; and
   a second electrode formed on the insulating layer, comprising a second pad and a second extension extending from the second pad along a long side of the light-emitting diode toward the first electrode and having a width smaller than that of the second pad,
   wherein the second extension is disposed on the recess and electrically connects to the conductive layer through the first opening and electrically insulated from the first semiconductor layer through insulating island, and
   wherein in a plan view, the second extension has a width smaller than that of the recess.

10. The light-emitting diode of claim 9, wherein the insulating island covers the side wall and the bottom of the recess.

11. The light-emitting diode of claim 10, wherein the second extension contacts the insulating island.

12. The light-emitting diode of claim 10, wherein the conductive layer comprises a second opening corresponding the recess.

13. The light-emitting diode of claim 12, wherein the second opening has a width smaller than that of the insulating island.

14. The light-emitting diode of claim 12, wherein the second opening has a width larger than that of the insulating islands, and the second extension contacts the second semiconductor layer through the first opening.

15. A light-emitting diode, comprising:
- a semiconductor stack, comprising a first semiconductor layer, an active region, and a second semiconductor layer;
- an insulating layer formed on the semiconductor stack, comprising a first opening on the second semiconductor layer and a plurality of insulating islands separately disposed in the first opening in a plan view;
- a first electrode formed on the insulating layer, electrically connected to the first semiconductor layer;
- a second electrode formed on the semiconductor stack, comprising a pad and an extension extending from the pad along a long side of the light-emitting diode toward the first electrode; and
- a conductive layer formed between the second semiconductor layer and the insulating layer, electrically connected to the second electrode;
- wherein the extension electrically connects to the conductive layer through the first opening, laterally extends along the first opening and covers the plurality of insulating islands.

16. The light-emitting diode of claim 15, wherein the first opening comprises a first part under the pad and a second part out of the pad.

17. The light-emitting diode of claim 16, wherein the conductive layer comprises a second opening at the first part of the first opening.

18. The light-emitting diode of claim 17, wherein the pad contacts the second semiconductor layer through the second opening and the first part of the first opening.

19. The light-emitting diode of claim 16, wherein the extension extends along the second part of the first opening.

20. The light-emitting diode of claim 16, wherein the insulating island has a width larger than that of the extension and smaller than that of the second part of the first opening.

* * * * *